(12) United States Patent
Cobb et al.

(10) Patent No.: US 12,425,871 B2
(45) Date of Patent: Sep. 23, 2025

(54) METHODS AND SYSTEMS FOR ACCESS POINT PLACEMENT OPTIMIZATION IN LOW-SIGNAL WORKSITE ENVIRONMENTS

(71) Applicant: Caterpillar Inc., Peoria, IL (US)

(72) Inventors: Mason Cobb, Peoria, IL (US); Joel Miller, Washington, IL (US)

(73) Assignee: Caterpillar Inc., Peoria, IL (US)

( * ) Notice: Subject to any disclaimer, the term of this patent is extended or adjusted under 35 U.S.C. 154(b) by 620 days.

(21) Appl. No.: 17/841,315

(22) Filed: Jun. 15, 2022

(65) Prior Publication Data

US 2023/0413065 A1 Dec. 21, 2023

(51) Int. Cl.
| | |
|---|---|
| *H04W 16/18* | (2009.01) |
| *E02F 9/26* | (2006.01) |
| *G06F 30/20* | (2020.01) |
| *H04B 17/318* | (2015.01) |
| *H04B 17/391* | (2015.01) |
| *H04W 24/06* | (2009.01) |
| *H04W 24/10* | (2009.01) |
| *H04W 88/08* | (2009.01) |

(52) U.S. Cl.
CPC ............ *H04W 16/18* (2013.01); *E02F 9/262* (2013.01); *G06F 30/20* (2020.01); *H04B 17/318* (2015.01); *H04B 17/3912* (2015.01); *H04W 24/06* (2013.01); *H04W 24/10* (2013.01); *H04W 88/08* (2013.01)

(58) Field of Classification Search
CPC ..... H04W 16/18; H04W 24/06; H04W 24/10; H04W 88/08; H04W 24/02; E02F 9/262; G06F 30/20; H04B 17/318; H04B 17/3912
See application file for complete search history.

(56) References Cited

U.S. PATENT DOCUMENTS

| | | | | |
|---|---|---|---|---|
| 6,336,035 | B1 * | 1/2002 | Somoza ............... | H04W 16/18 455/457 |
| 9,426,674 | B2 * | 8/2016 | Pulleti ...................... | G05D 1/43 |
| 2005/0245252 | A1 * | 11/2005 | Kappes ................. | H04W 16/18 455/446 |
| 2007/0050137 | A1 * | 3/2007 | Woon ..................... | E02F 9/265 709/217 |
| 2007/0268852 | A1 * | 11/2007 | Stegmaier .............. | E02F 3/841 370/328 |

(Continued)

OTHER PUBLICATIONS

"A Wireless Network Communication Pattern for Remote Mining and Unmanned Mining"; Meng et al; Proceedings of IC-BNMT2010; Oct. 2010 (Year: 2010).*

(Continued)

*Primary Examiner* — Benjamin H Elliott, IV (57) ABSTRACT

A method for worksite access point placement optimization, the method including: generating a connectivity profile for a machine; receiving a worksite definition for a worksite; simulating a machine path within the worksite according to the worksite definition; estimating connection strength at the machine, based on the connectivity profile, for multiple locations along the machine path and for multiple access point locations around the worksite; and providing a map of the worksite including an indication of relative overall connection strength for each of the multiple access point locations.

16 Claims, 10 Drawing Sheets

(56) References Cited

U.S. PATENT DOCUMENTS

| | | | | |
|---|---|---|---|---|
| 2009/0096637 | A1* | 4/2009 | Olson | E02F 9/26 |
| | | | | 340/993 |
| 2012/0140642 | A1* | 6/2012 | Beck | H04W 88/08 |
| | | | | 370/252 |
| 2015/0023208 | A1* | 1/2015 | Beck | H04W 24/08 |
| | | | | 370/254 |
| 2015/0223080 | A1* | 8/2015 | Pulleti | G05D 1/6987 |
| | | | | 455/446 |
| 2016/0231426 | A1* | 8/2016 | Smith | G01S 17/06 |
| 2018/0041985 | A1* | 2/2018 | Davaadorj | H04W 64/003 |
| 2019/0082328 | A1* | 3/2019 | Garcia | H04W 24/02 |
| 2021/0173392 | A1* | 6/2021 | Santos | E21C 35/24 |
| 2021/0266758 | A1* | 8/2021 | Fujiwaka | H04W 64/006 |
| 2021/0409976 | A1* | 12/2021 | Ergen | H04W 72/541 |
| 2022/0026215 | A1* | 1/2022 | Vainio | G01C 22/00 |
| 2022/0251809 | A1* | 8/2022 | Sanerma | E02F 9/205 |
| 2023/0379814 | A1* | 11/2023 | Erta | H04B 17/318 |
| 2023/0413065 | A1* | 12/2023 | Cobb | H04B 17/318 |
| 2024/0360633 | A1* | 10/2024 | Friend | E02F 9/262 |

OTHER PUBLICATIONS

Written Opinion and International Search Report for Int'l. Patent Appln. No.PCT/US2023/021965, mailed Oct. 11, 2023 (14 pgs).

* cited by examiner

METHODS AND SYSTEMS FOR ACCESS POINT PLACEMENT OPTIMIZATION IN LOW-SIGNAL WORKSITE ENVIRONMENTS

TECHNICAL FIELD

This patent application is directed to access point placement optimization, and more specifically, to generating access point placement recommendations for autonomous machines in a worksite environment.

BACKGROUND

Radio controlled and autonomous operation of machines requires a stable connection to the transmitter. When the signal falls short of acceptable range, the operation of the machine will stop. When this occurs production on the jobsite comes to a stop until connection with the machine is reestablished. A machine that is not connected impacts the efficiency of a jobsite, and ultimately will impact profit. If a machine loses connection it could impact the progress of more machines and/or traffic flow. Wireless network access points are currently deployed in locations based on opinions without any quantitative data to support the placement. Without quantitative results the signal coverage could result in an area that is larger than being capable of being covered or the density of the signal is greater than it needs to be. Both situations create waste. Not having coverage capable of covering the intended area will result in dead or drop out zones. While having excess coverage will create the need to have more placement moves of the access points, which can result in time and cost to the customer.

Efforts have been made to preplan wireless networks for e.g., open-pit and underground mines. For example, U.S. Patent Application Publication No. 2019/082328 to Garcia et al., (hereinafter "Garcia") describes a method to combine mine planning and network planning processes to enable the installation of cheaper wireless networks.

According to Garcia, Network Planning is the planning before the installation of a wireless transmission network on any environment. There are several types of wireless networks, and the most common are those which employ a combination of fixed antennas, portable routers, and onboard routers linked to the bodies of trucks, shovels and other machines. Wireless network planning operation is usually performed by using a specialized software, such as ASSET™ network planning tool, MENTUM PLANET™ network planning tool, WINPROP™ radio planning tool, and WIRELESS INSIGHT™ propagation software (with ray-tracing models).

Based on data obtained during the exploration phase of the mine, such as data from sampling and geophysical profiling, the productive area of the mine is mapped. In this phase, the deposit points where there is a higher concentration of minerals are determined and a three-dimensional map of the productive areas is outlined. Some of the tools currently available in the market for Mine Planning include VULCAN™ mining software, GEOVIA WHITTLE™ mining software, DATAMINE™ mining software, MINESIGHT™ mining software, and GEOPIT™ mining software.

As the topography of a mine changes constantly, any planning, especially broadband, can become obsolete in a short time. This, in practice, involves a series of reactive and expensive redesigns over the entire length of mine lifecycle. Garcia's technology makes available the data from Mine Planning as inputs to Network Planning. In other words, with Garcia's tool, the layout planning of nodes of the wireless network will take into account the current and future provisions of mine topography.

While Garcia's technology takes into account predicted changes to topography for an open pit mine, it does not account for the unique characteristics of different types of machines performing different activities. Thus, there remains a need to improve wireless network access point planning. The example systems and methods described herein are directed to overcoming one or more of the deficiencies described above and/or other problems with the prior art.

SUMMARY

In some aspects, the techniques described herein relate to a method for worksite access point placement optimization, the method including: generating a connectivity profile for a machine; receiving a worksite definition for a worksite; simulating a machine path within the worksite according to the worksite definition; estimating connection strength at the machine, based on the connectivity profile, for multiple locations along the machine path and for multiple access point locations around the worksite; and providing a map of the worksite including an indication of relative overall connection strength for each of the multiple access point locations.

In some aspects, the techniques described herein relate to a method, wherein the machine path includes direction and incline information for each location along the machine path.

In some aspects, the techniques described herein relate to a method, further including indicating recommended access point locations.

In some aspects, the techniques described herein relate to a method, wherein generating the connectivity profile includes operating the machine in an area at least partially covered by one or more test access points and recording signal strength at the machine for each of the one or more test access points, orientation with respect to each of the one or more test access points, and distance from each of the one or more test access points.

In some aspects, the techniques described herein relate to a method, wherein orientation includes which direction the front of the machine is facing with respect to each of the one or more test access points.

In some aspects, the techniques described herein relate to a method, wherein generating the connectivity profile further includes recording a machine configuration.

In some aspects, the techniques described herein relate to a system for worksite access point placement optimization, including: one or more processors; and one or more memory devices having stored thereon instructions that when executed by the one or more processors cause the one or more processors to: generate a connectivity profile for a machine; receive a worksite definition for a worksite; simulate a machine path within the worksite according to the worksite definition; estimate connection strength at the machine, based on the connectivity profile, for multiple locations along the machine path and for multiple access point locations around the worksite; and provide a map of the worksite including an indication of relative overall connection strength for each of the multiple access point locations.

In some aspects, the techniques described herein relate to a system, wherein the machine path includes direction and incline information for each location along the machine path.

In some aspects, the techniques described herein relate to a system, further including indicating recommended access point locations.

In some aspects, the techniques described herein relate to a system, wherein generating the connectivity profile includes operating the machine in an area at least partially covered by one or more test access points and recording signal strength at the machine for each of the one or more test access points, orientation with respect to each of the one or more test access points, and distance from each of the one or more test access points.

In some aspects, the techniques described herein relate to a system, wherein orientation includes which direction the front of the machine is facing with respect to each of the one or more test access points.

In some aspects, the techniques described herein relate to a system, wherein generating the connectivity profile further includes recording a machine configuration.

In some aspects, the techniques described herein relate to a system for worksite access point placement optimization, including: one or more processors; and one or more memory devices having stored thereon instructions that when executed by the one or more processors cause the one or more processors to: generate a connectivity profile for a machine, including: operating the machine in an area at least partially covered by one or more test access points; and recording signal strength at the machine for each of the one or more test access points, orientation with respect to each of the one or more test access points, and distance from each of the one or more test access points; receive a worksite definition for a worksite; simulate a machine path within the worksite according to the worksite definition; estimate connection strength at the machine, based on the connectivity profile, for multiple locations along the machine path and for multiple access point locations around the worksite; and provide a map of the worksite including an indication of relative overall connection strength for each of the multiple access point locations.

In some aspects, the techniques described herein relate to a system, wherein the machine path includes direction and incline information for each location along the machine path.

In some aspects, the techniques described herein relate to a system, further including indicating recommended access point locations.

In some aspects, the techniques described herein relate to a system, wherein orientation includes which direction the front of the machine is facing with respect to each of the one or more test access points.

In some aspects, the techniques described herein relate to a system, wherein generating the connectivity profile further includes recording a machine configuration.

In some aspects, the techniques described herein relate to a system, further including wireless hardware positioned on the machine, wherein the signal strength at the machine is received from the wireless hardware.

BRIEF DESCRIPTION OF THE DRAWINGS

The systems and methods described herein may be better understood by referring to the following Detailed Description in conjunction with the accompanying drawings, in which like reference numerals indicate identical or functionally similar elements.

The headings provided herein are for convenience only and do not necessarily affect the scope of the embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, combinations, equivalents, and alternatives falling within the scope of this disclosure.

DETAILED DESCRIPTION

Various examples of the systems and methods introduced above will now be described in further detail. The following description provides specific details for a thorough understanding and enabling description of these examples. One skilled in the relevant art will understand, however, that the techniques and technology discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Disclosed herein are methods and systems for worksite access point placement optimization. The disclosed technology can include generating a connectivity profile for multiple types of machines. Generating these profiles includes operating the machines in an area at least partially covered by test access points and recording signal strength at the machines for each access point, orientation with respect to each of the access points, and distance from each of the access points. While simulating a machine path within a worksite according to a worksite definition a connection strength at the machine is estimated, based on the connectivity profile, for multiple locations along the machine's path and for multiple access point locations around the worksite. Using these estimations a map of the worksite can be generated that includes an indication of relative overall connection strength for each of the multiple access point locations along with recommended access point locations.

Figure 1:
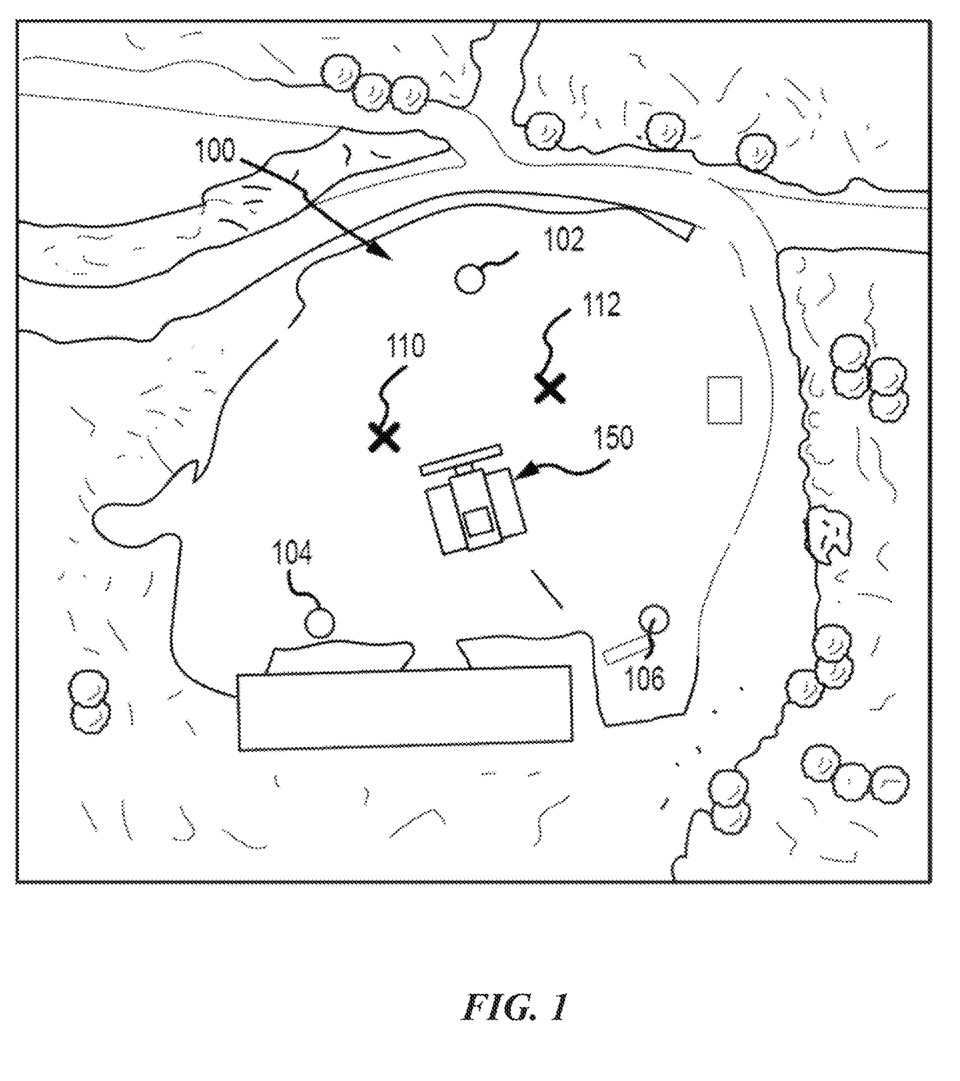
FIG. 1 is a diagram illustrating a worksite environment in which some implementations can operate according to embodiments of the disclosed technology.

FIG. 1 illustrates a worksite environment 100 in which access points 102, 104, and 106 have been placed according to conventional techniques resulting in drop out zones 110 and 112. Thus, as machine 150 moves around the worksite 100 it may encounter a drop out zone 110/112 and lose connectivity. As noted above a loss of connectivity can result in costly work stoppages. There are many variables that could cause connectivity issues such as wireless infrastructure, machine signal strength, and machines switching between access points.

In order to help prevent drop out zones and provide optimum access point placement the disclosed technology takes into account the signal strength as measured at the machine. Different machine types and configurations can have different signal reception characteristics. The disclosed system and methods account for these differences by generating a connectivity profile for multiple types of machines and corresponding configurations (e.g., different attachments). For example, profiles can be generated for excavators, bulldozers, dump trucks, graders, compactors, etc.

Figure 2:
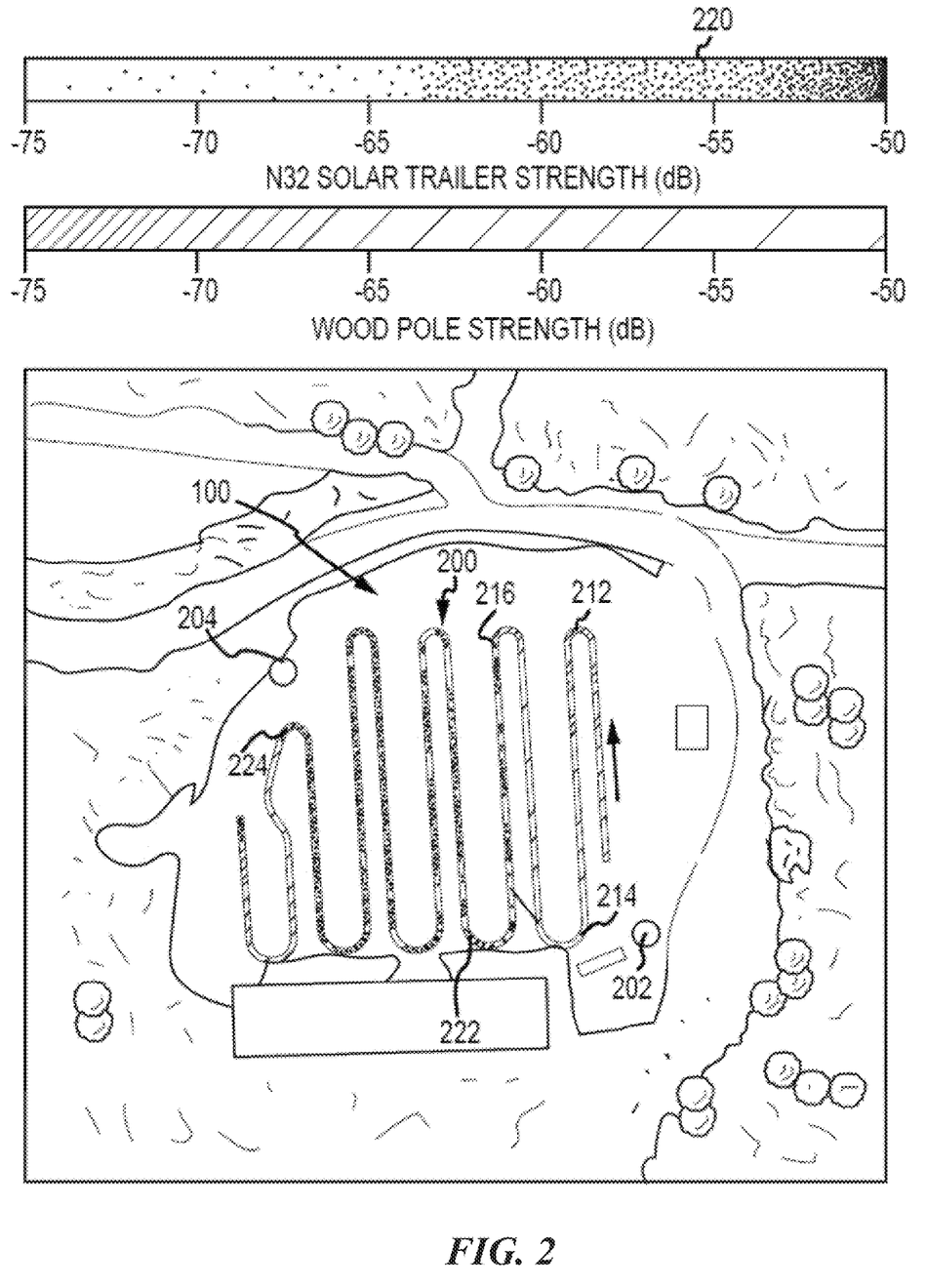
FIG. 2 is a diagram illustrating signal strength along a machine path from two test access points according to some embodiments of the disclosed technology.

With reference to FIG. 2, generating the connectivity profile for a machine can include operating the machine along a path 200 in the worksite 100 and recording signal strength at the machine for multiple positions along the path 200 for each of one or more test access points, such as access points 202 and 204. For each location along the path 200 the system can record position data (e.g., latitude, longitude, elevation), signal strength (e.g., RSSI, noise), access point identifier, orientation with respect to current access point, distance from current access point, machine incline angle, etc.

In the depicted example, from the machine's point of view the signal strength from access point 202 is relatively weak at location 212 given the distance and orientation (e.g., angle) with respect to access point 202. The relative strength of the signal from access point 202 is indicated by scale 210 as approximately 67 dB. At location 214, the signal strength from access point 202 is relatively strong (55 dB) given the distance between the location and access point. At location 216 the signal strength from access point 202 drops out and the system switches from access point 202 to access point 204. At location 222 the signal strength from access point 222 is relatively weak (65 dB) and at location 224 the signal strength as indicated by scale 220 is relatively strong at approximately 57 dB.

Figure 3A:
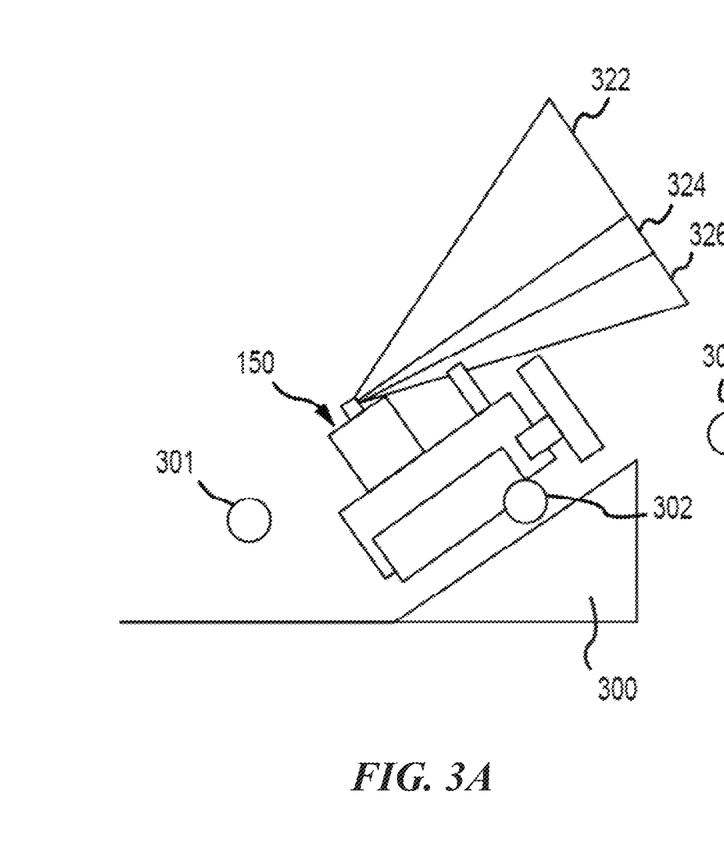
FIGS. 3A and 3B are diagrams illustrating signal strength zones related to a particular machine according to some embodiments of the disclosed technology.
Figure 3B:
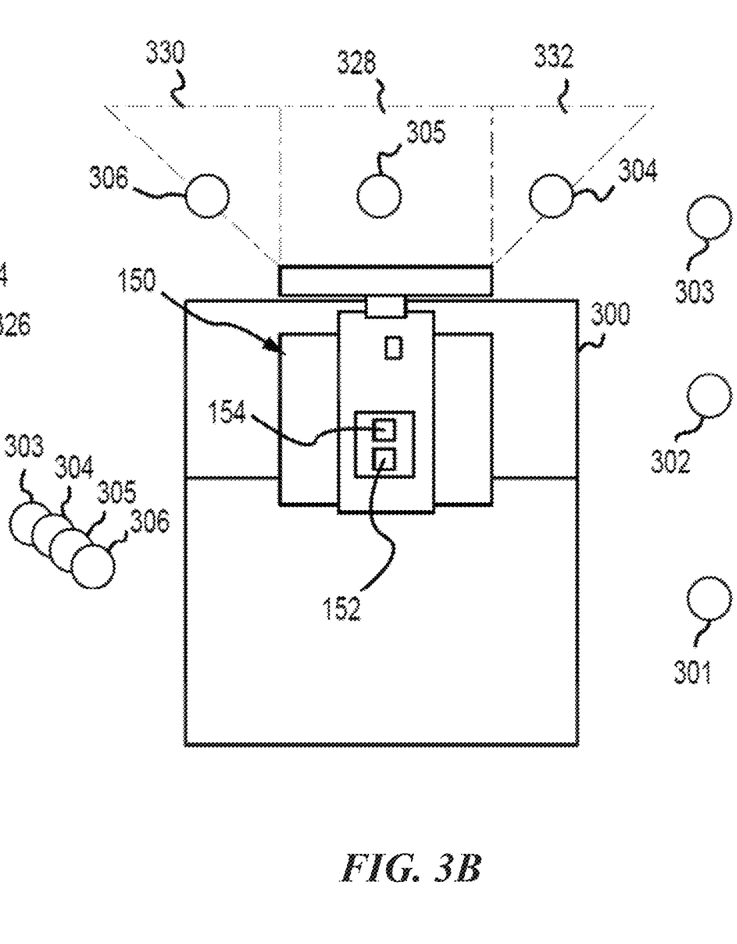

FIGS. 3A and 3B are diagrams depicting a connectivity profile for a machine 150 including signal strength zones 322-332. Zones 322 and 328 indicate relatively strong signal strength; zones 324, 330, and 332 are medium strength zones; and zone 326 is relatively weak. It can be seen in the depicted embodiment that an incline 300 can affect the signal strength to the machine. Also, some of the access points 301-306 do not fall within the prerecorded connectivity profile (e.g., they are below 326 in FIG. 3A). Therefore, those access points would not have any connection to the machine. While simulating a worksite machine path the system can record that these access point locations have no connection. For access points 301-306 that are inside of the connectivity profile, the system can record the estimated signal strength at each location. In some embodiments, the machine can include a GPS receiver 152 as well as a communications receiver/transmitter 154. In some embodiments, the signal strength zones can represent a signal attenuation factor (e.g., percentage) that is applied to a predicted signal strength from a network planning tool.

Figure 4:
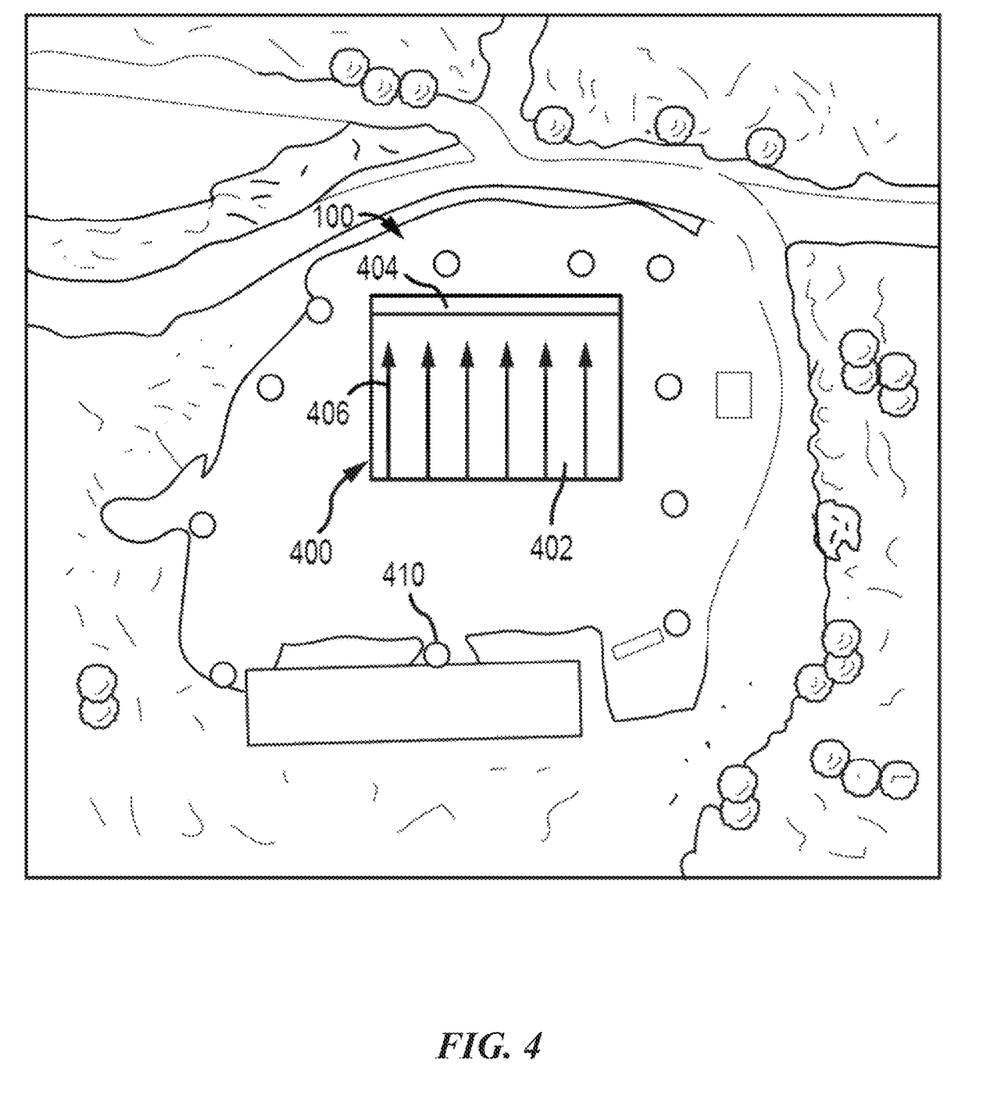
FIG. 4 is a diagram illustrating a work area for simulating topography changes according to some embodiments of the disclosed technology.

FIG. 4 is a diagram illustrating a worksite area 400 according to a worksite definition. The worksite definition can include machine paths, for multiple machines, such as machine path 406, and for various activities. For example, worksite area 400 includes a flat region 402 designated for topsoil skimming and a resulting hill or incline 404 forming at the end of the skimmed region 402. With these inputs a machine's path (e.g., location), orientation, and configuration can be simulated for the entire skimming process. While simulating the machine's path within the worksite 100 according to the worksite definition a connection strength at the machine is estimated, based on the machine's connectivity profile, for multiple locations along the machine's path and for multiple access point locations 410 around the worksite 100. Using these estimations a map of the worksite can be generated that includes an indication of relative overall connection strength for each of the multiple access point locations along with recommended access point locations.

Figure 5:
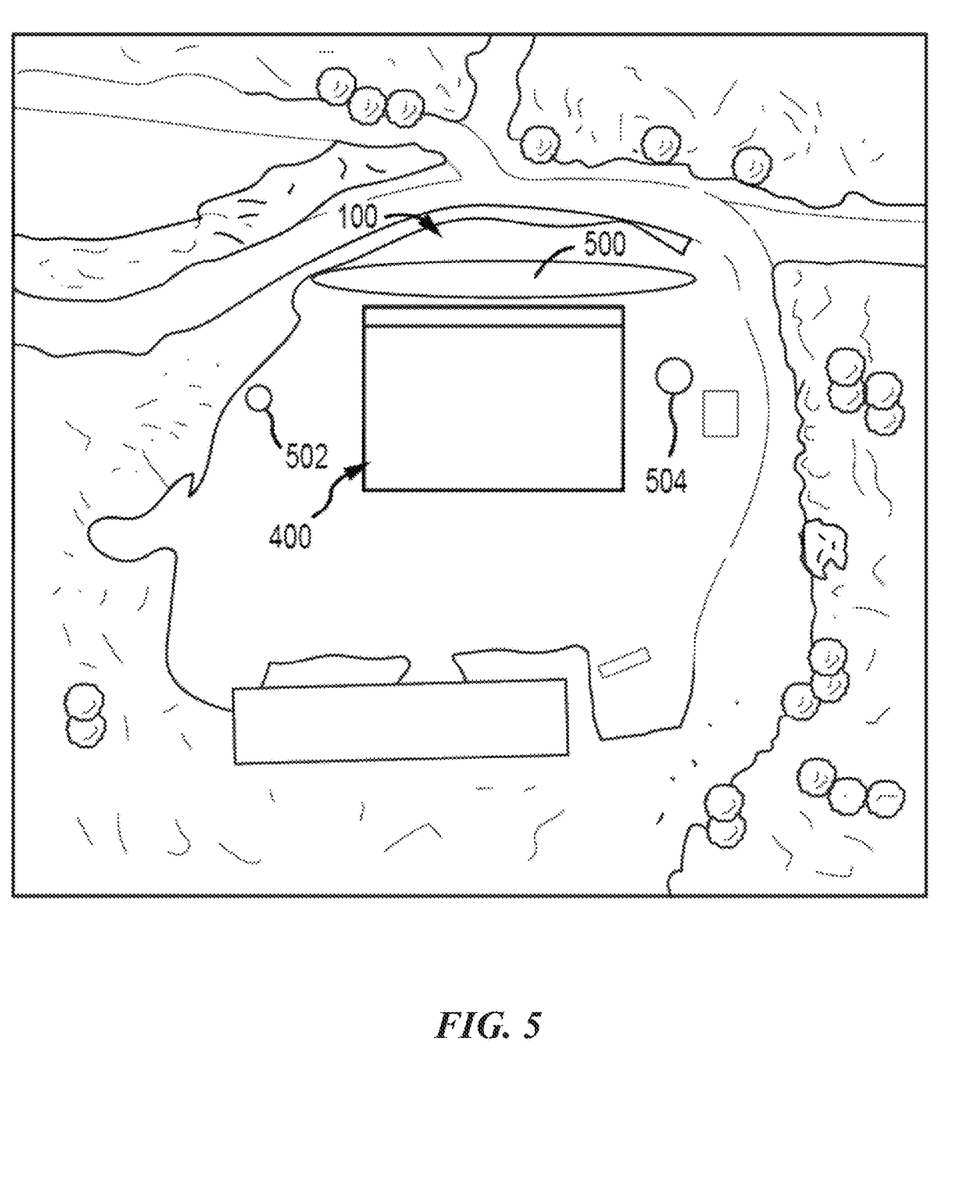
FIG. 5 is a diagram of a map illustrating access point recommendations and low signal strength regions according to some embodiments of the disclosed technology.

FIG. 5 is a diagram of a map illustrating access point recommendations and low signal strength regions according to some embodiments of the disclosed technology. In some embodiments, the estimated signal strength for all locations along the machine path can be averaged for each access point. The recommended access point locations 502 and 504 can be those that have the best average signal strength. In some embodiments, low signal strength regions such as region 500 can be identified as the access points with the lowest average signal strength or as having a signal strength below a selected threshold. In some embodiments, the map can include a heat map of signal strength for each access point. The map can also include a machine path indicating signal strength from an access point along the path such as shown in FIG. 2. In some embodiments, the connectivity in the active areas can be weighted as a higher priority than the entire work area. In some embodiments, the process can be iterated for multiple different machines and access point hardware to generate recommendations for machine(s) to use as well as hardware. Furthermore, the worksite definition and corresponding simulation can include changes in topography and/or location over time (e.g., road construction). The system can recommend optimal access point placement in stages as a job or project progresses.

Figure 6:
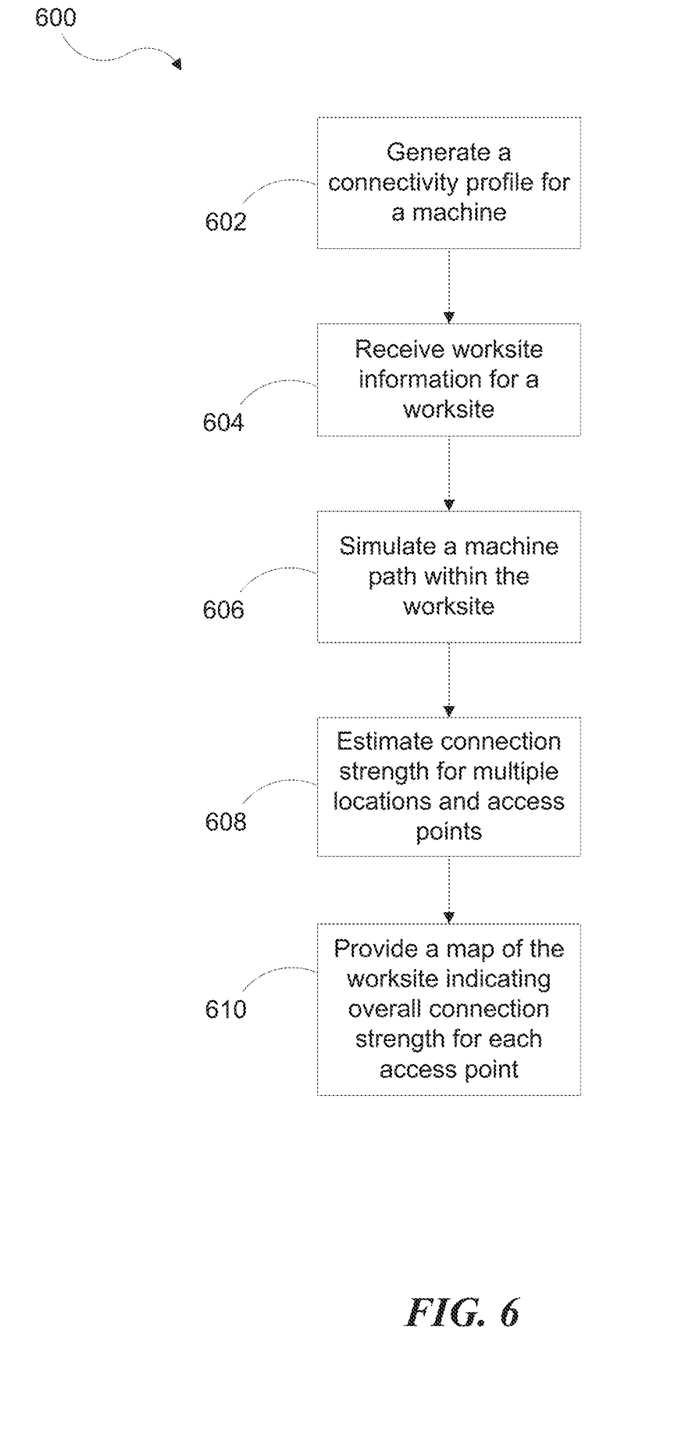
FIG. 6 is a flow diagram showing a method for worksite access point placement optimization according to some embodiments of the disclosed technology.

FIG. 6 is a flow diagram showing a method 600 for worksite access point placement optimization according to some embodiments of the disclosed technology. The method can include generating a connectivity profile for a machine at step 602 and receiving a worksite definition for a worksite at step 604. A machine path within the worksite can be simulated according to the worksite definition at step 606 and a connection strength at the machine can be estimated at step 608, based on the connectivity profile, for multiple locations along the machine path and for multiple access point locations around the worksite. At step 610, a map of the worksite can be provided including an indication of relative overall connection strength for each of the multiple access point locations as well as recommended access point locations. In some embodiments, the machine path can include direction and incline information for each location along the machine path.

Figure 7:
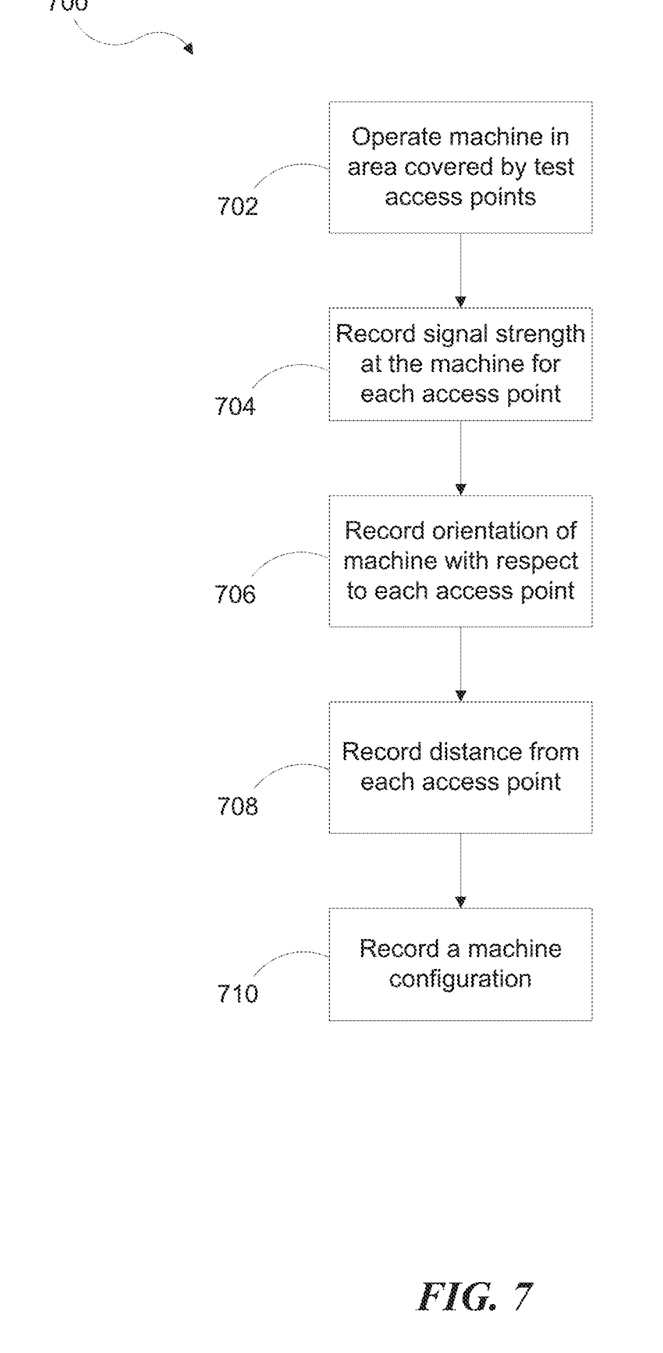
FIG. 7 is a flow diagram showing a method for generating a connectivity profile for a machine according to some embodiments of the disclosed technology.

FIG. 7 is a flow diagram showing a method 700 for generating a connectivity profile for a machine according to some embodiments of the disclosed technology. Generating the connectivity profile can include operating the machine in an area at least partially covered by one or more test access points at step 702 and recording signal strength at the machine, at step 704, for each of the one or more test access points. The method can also include recording orientation with respect to each of the one or more test access points at step 706 and recording distance from each of the one or more test access points at step 708. In some embodiments, generating the connectivity profile further comprises recording a machine configuration at step 710. In some embodiments, the orientation can include which direction the front of the machine is facing with respect to each of the one or more test access points.

Suitable System

The techniques disclosed here can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions which may be used to cause a computer, a microprocessor, processor, and/or microcontroller (or other electronic devices) to perform a process. The machine-readable medium may include, but is not limited to, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

Figure 8:
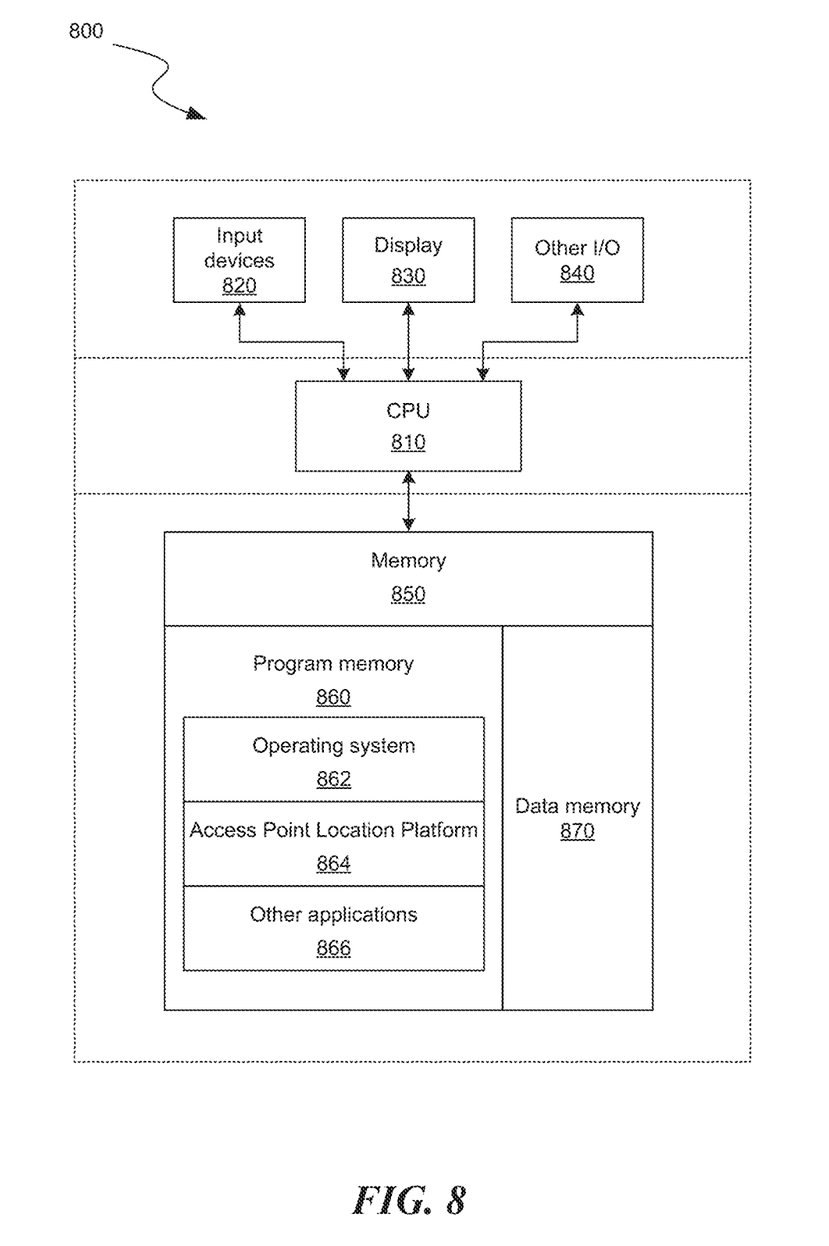
FIG. 8 is a block diagram illustrating an overview of devices on which some implementations can operate.

Several implementations are discussed below in more detail in reference to the figures. FIG. 8 is a block diagram illustrating an overview of devices on which some implementations of the disclosed technology can operate. Device 800 can include one or more input devices 820 that provide input to the CPU (processor) 810, notifying it of actions. The actions are typically mediated by a hardware controller that interprets the signals received from the input device and communicates the information to the CPU 810 using a communication protocol. Input devices 820 include, for example, a mouse, a keyboard, a touchscreen, an infrared sensor, a touchpad, a wearable input device, a camera- or image-based input device, a microphone, or other user input devices.

CPU 810 can be a single processing unit or multiple processing units in a device or distributed across multiple devices. CPU 810 can be coupled to other hardware devices, for example, with the use of a bus, such as a PCI bus or SCSI bus. The CPU 810 can communicate with a hardware controller for devices, such as for a display 830. Display 830 can be used to display text and graphics. In some examples, display 830 provides graphical and textual visual feedback to a user. In some implementations, display 830 includes the input device as part of the display, such as when the input device is a touchscreen or is equipped with an eye direction monitoring system. In some implementations, the display is separate from the input device. Examples of display devices are: an LCD display screen; an LED display screen; a projected, holographic, or augmented reality display (such as a heads-up display device or a head-mounted device); and so on. Other I/O devices 840 can also be coupled to the processor, such as a network card, video card, audio card, USB, FireWire or other external device, sensor, camera, printer, speakers, CD-ROM drive, DVD drive, disk drive, or Blu-Ray device.

In some implementations, the device 800 also includes a communication device capable of communicating wirelessly or wire-based with a network node. The communication device can communicate with another device or a server through a network using, for example, TCP/IP protocols. Device 800 can utilize the communication device to distribute operations across multiple network devices.

The CPU 810 can have access to a memory 850. A memory includes one or more of various hardware devices for volatile and non-volatile storage, and can include both read-only and writable memory. For example, a memory can comprise random access memory (RAM), CPU registers, read-only memory (ROM), and writable non-volatile memory, such as flash memory, hard drives, floppy disks, CDs, DVDs, magnetic storage devices, tape drives, device buffers, and so forth. A memory is not a propagating signal divorced from underlying hardware; a memory is thus non-transitory. Memory 850 can include program memory 860 that stores programs and software, such as an operating system 862, access point location platform 864, and other application programs 866. Memory 850 can also include data memory 870 that can include database information, etc., which can be provided to the program memory 860 or any element of the device 800.

Some implementations can be operational with numerous other general purpose or special purpose computing system environments or configurations. Examples of well-known computing systems, environments, and/or configurations that may be suitable for use with the technology include, but are not limited to, personal computers, server computers, handheld or laptop devices, cellular telephones, mobile phones, wearable electronics, gaming consoles, tablet devices, multiprocessor systems, microprocessor-based systems, programmable consumer electronics, network PCs, minicomputers, mainframe computers, distributed computing environments that include any of the above systems or devices, or the like.

Figure 9:
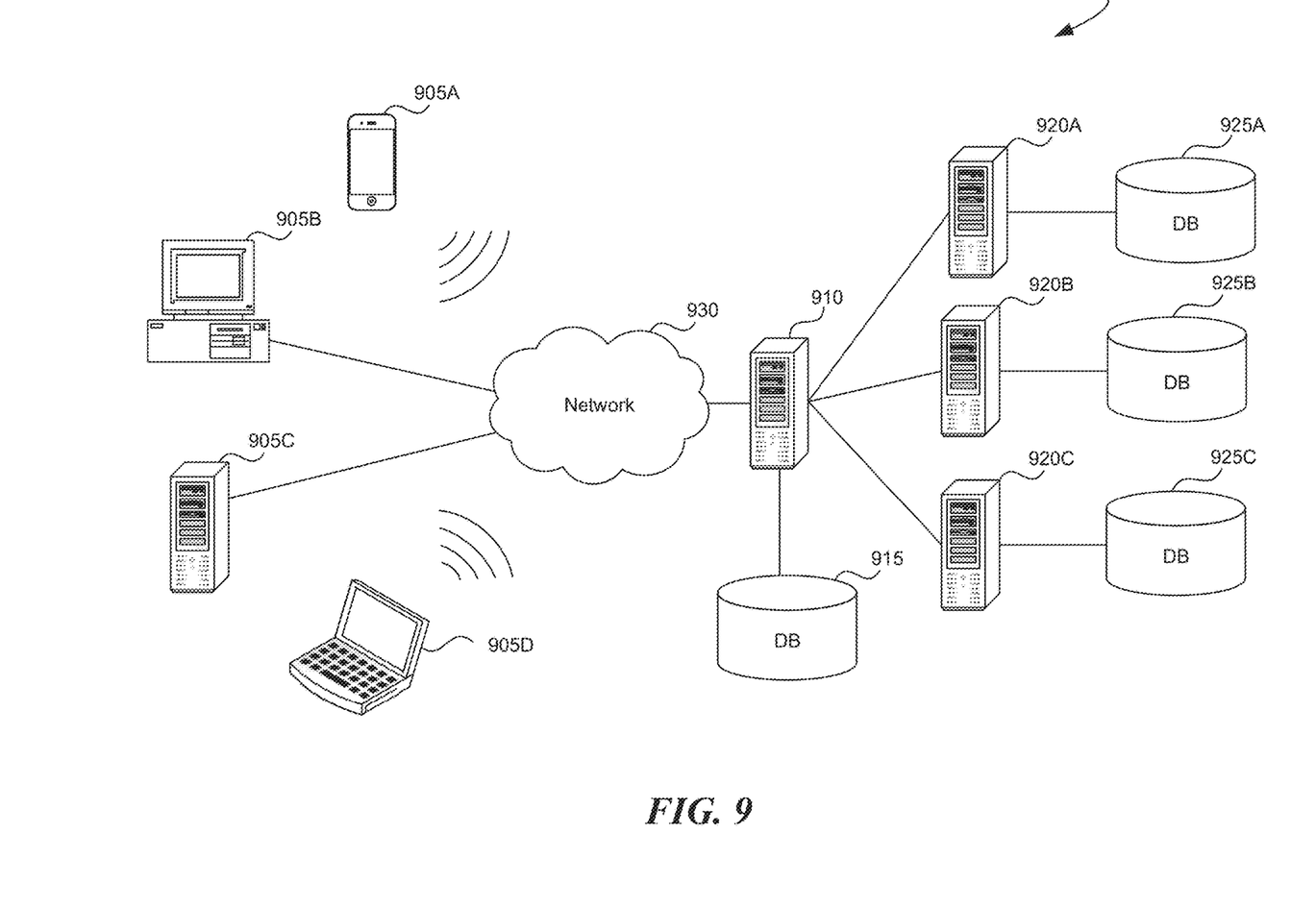
FIG. 9 is a block diagram illustrating an overview of an environment in which some implementations can operate.

FIG. 9 is a block diagram illustrating an overview of an environment 900 in which some implementations of the disclosed technology can operate. Environment 900 can include one or more client computing devices 905A-D, examples of which can include device 800. Client computing devices 905 can operate in a networked environment using logical connections through network 930 to one or more remote computers, such as a server computing device 910.

In some implementations, server computing device 910 can be an edge server that receives client requests and coordinates fulfillment of those requests through other servers, such as servers 920A-C. Server computing devices 910 and 920 can comprise computing systems, such as device 800. Though each server computing device 910 and 920 is displayed logically as a single server, server computing devices can each be a distributed computing environment encompassing multiple computing devices located at the same or at geographically disparate physical locations. In some implementations, each server computing device 920 corresponds to a group of servers.

Client computing devices 905 and server computing devices 910 and 920 can each act as a server or client to other server/client devices. Server 910 can connect to a database 915. Servers 920A-C can each connect to a corresponding database 925A-C. As discussed above, each server 920 can correspond to a group of servers, and each of these servers can share a database or can have their own database. Databases 915 and 925 can warehouse (e.g., store) information. Though databases 915 and 925 are displayed logically as single units, databases 915 and 925 can each be a distributed computing environment encompassing multiple computing devices, can be located within their corresponding server, or can be located at the same or at geographically disparate physical locations.

Network 930 can be a local area network (LAN) or a wide area network (WAN), but can also be other wired or wireless networks. Network 930 may be the Internet or some other public or private network. Client computing devices 905 can be connected to network 930 through a network interface, such as by wired or wireless communication. While the connections between server 910 and servers 920 are shown as separate connections, these connections can be any kind of local, wide area, wired, or wireless network, including network 930 or a separate public or private network.

Figure 10:
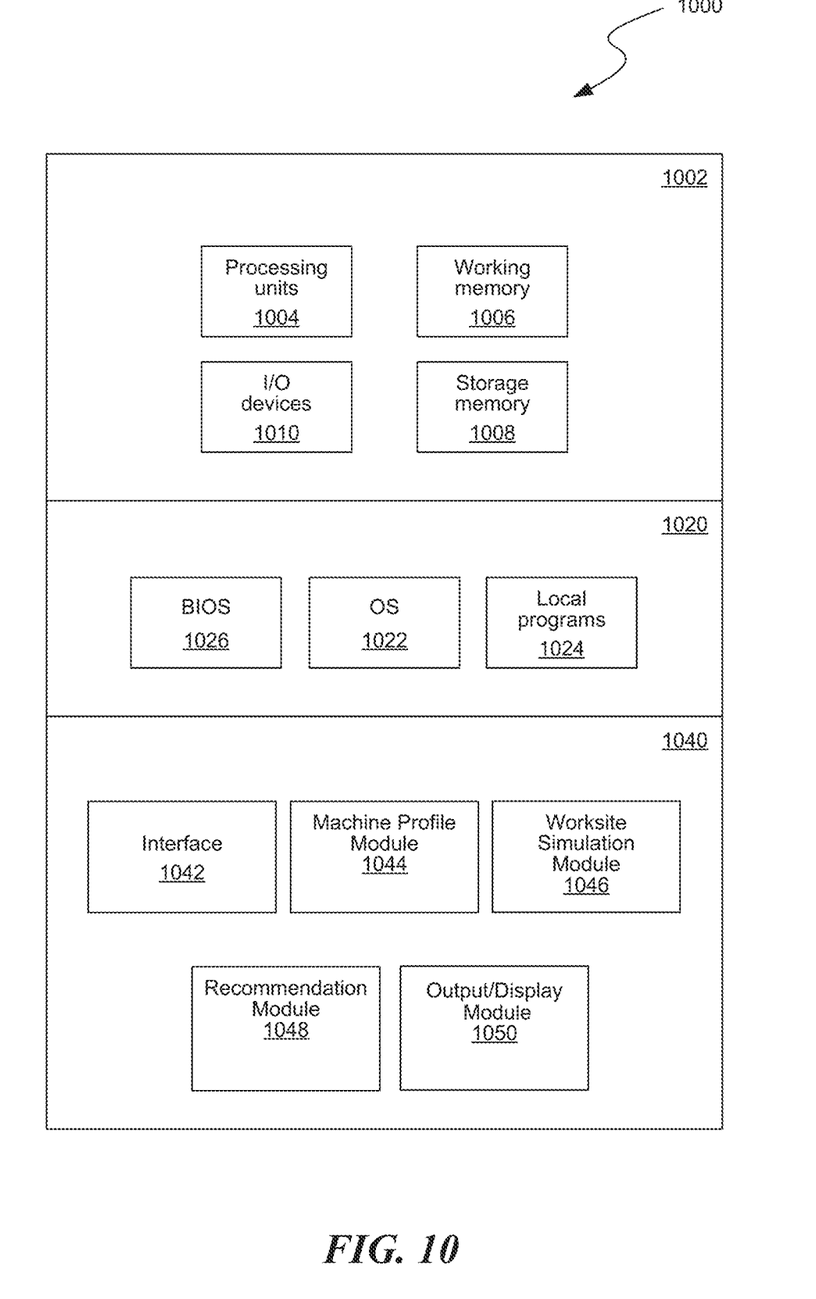
FIG. 10 is a block diagram illustrating components which, in some implementations, can be used in a system employing the disclosed technology.

FIG. 10 is a block diagram illustrating components 1000 which, in some implementations, can be used in a system employing the disclosed technology. The components 1000 include hardware 1002, general software 1020, and specialized components 1040. As discussed above, a system implementing the disclosed technology can use various hardware, including processing units 1004 (e.g., CPUs, GPUs, APUs, etc.), working memory 1006, storage memory 1008, and input and output devices 1010. Components 1000 can be implemented in a client computing device such as client computing devices 905 or on a server computing device, such as server computing device 910 or 920.

General software 1020 can include various applications, including an operating system 1022, local programs 1024, and a basic input output system (BIOS) 1026. Specialized components 1040 can be subcomponents of a general software application 1020, such as local programs 1024. Specialized components 1040 can include a Machine Profile Module 1044, a Worksite Simulation Module 1046, a Recommendation Module 1048, an Output/Display Module 1050, and components that can be used for transferring data and controlling the specialized components, such as Interface 1042. In some implementations, components 1000 can be in a computing system that is distributed across multiple computing devices or can be an interface to a server-based application executing one or more of specialized components 1040.

Those skilled in the art will appreciate that the components illustrated in FIGS. 8-10 described above, and in each of the flow diagrams discussed above, may be altered in a variety of ways. For example, the order of the logic may be rearranged, sub steps may be performed in parallel, illustrated logic may be omitted, other logic may be included, etc. In some implementations, one or more of the components described above can execute one or more of the processes described herein.

Industrial Applicability

In some embodiments, a system for worksite access point placement optimization can include a Machine Profile Module 1044, a Worksite Simulation Module 1046, a Recommendation Module 1048, and an Output/Display Module 1050 (FIG. 10). In operation, the Machine Profile Module 1044 can record signal strength at a machine for multiple positions along a path for each of one or more test access points. For each location along the path the system can record position data (e.g., latitude, longitude, elevation), signal strength (e.g., RSSI, noise), access point identifier, orientation with respect to current access point, distance from current access point, machine incline angle, etc. This information can define zones where a particular machine has different abilities to receive and transmit data. In some cases, these signal strength zones can represent a signal attenuation factor that is applied to a predicted signal strength from a network planning tool, for example.

The Worksite Simulation Module 1046 can simulate the machine's path within a worksite according to a worksite definition in order to estimate a connection strength at the machine. The connection strength is estimated based on the machine's connectivity profile, for multiple locations along the machine's path and for multiple access point locations around the worksite. Using these estimations a map of the worksite can be generated that includes an indication of relative overall connection strength for each of the multiple access point locations. The disclosed technology provides a more realistic simulation of the signal strength at a machine, as compared to conventional technology, by taking into account the characteristics of the machine in addition to predicted changes in topography of the worksite.

The Recommendation Module 1048 can average the estimated signal strength for all locations along the machine path for each access point. The recommended access point locations can be those that have the best average signal strength. In some embodiments, low signal strength regions can be identified as the access points with the lowest average signal strength or as having a signal strength below a selected threshold.

The Output/Display Module 1050 can output the access point location recommendations to a user and/or provide maps of the worksite. For example, a map can include a heat map of signal strength for each access point. The map can also include a machine path indicating signal strength from an access point along the path.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A method for worksite access point placement optimization, the method comprising:
    generating a connectivity profile for a machine, including:
        operating the machine in an area at least partially covered by one or more test access points; and
        recording signal strength at the machine for each of the one or more test access points, orientation with respect to each of the one or more test access points, and distance from each of the one or more test access points;
    receiving a worksite definition for a worksite;
    simulating a machine path within the worksite according to the worksite definition;
    estimating connection strength at the machine, based on the connectivity profile, for multiple locations along the machine path and for multiple access point locations around the worksite; and
    providing a map of the worksite including an indication of relative overall connection strength for each of the multiple access point locations.

2. The method of claim 1, wherein the machine path includes direction and incline information for each location along the machine path.

3. The method of claim 1, further comprising indicating recommended access point locations.

4. The method of claim 1, wherein orientation includes which direction a front of the machine is facing with respect to each of the one or more test access points.

5. The method of claim 1, wherein generating the connectivity profile further comprises recording a machine configuration.

6. A system for worksite access point placement optimization, comprising:
    one or more processors; and
    one or more memory devices having stored thereon instructions that when executed by the one or more processors cause the one or more processors to:
        generate a connectivity profile for a machine, during operation of the machine in an area at least partially covered by one or more test access points by:
            recording signal strength at the machine for each of the one or more test access points, orientation with respect to each of the one or more test access points, and distance from each of the one or more test access points;
        receive a worksite definition for a worksite;
        simulate a machine path within the worksite according to the worksite definition;
        estimate connection strength at the machine, based on the connectivity profile, for multiple locations along the machine path and for multiple access point locations around the worksite; and
        provide a map of the worksite including an indication of relative overall connection strength for each of the multiple access point locations.

7. The system of claim 6, wherein the machine path includes direction and incline information for each location along the machine path.

8. The system of claim 6, further comprising indicating recommended access point locations.

9. The system of claim 7, wherein orientation includes which direction a front of the machine is facing with respect to each of the one or more test access points.

10. The system of claim 7, wherein generating the connectivity profile further comprises recording a machine configuration.

11. A system for worksite access point placement optimization, comprising:
    one or more processors; and
    one or more memory devices having stored thereon instructions that when executed by the one or more processors cause the one or more processors to:
        generate a connectivity profile for a machine, including:
            operating the machine in an area at least partially covered by one or more test access points; and
            recording signal strength at the machine for each of the one or more test access points, orientation with respect to each of the one or more test access points, and distance from each of the one or more test access points;
        receive a worksite definition for a worksite;
        simulate a machine path within the worksite according to the worksite definition;
        estimate connection strength at the machine, based on the connectivity profile, for multiple locations along the machine path and for multiple access point locations around the worksite; and
        provide a map of the worksite including an indication of relative overall connection strength for each of the multiple access point locations.

12. The system of claim 11, wherein the machine path includes direction and incline information for each location along the machine path.

13. The system of claim 11, further comprising indicating recommended access point locations.

14. The system of claim 11, wherein orientation includes which direction a front of the machine is facing with respect to each of the one or more test access points.

15. The system of claim 14, wherein generating the connectivity profile further comprises recording a machine configuration.

16. The system of claim 11, further comprising wireless hardware positioned on the machine, wherein the signal strength at the machine is received from the wireless hardware.

* * * * *